US007390535B2

(12) United States Patent
Fairbourn

(10) Patent No.: US 7,390,535 B2
(45) Date of Patent: Jun. 24, 2008

(54) SIMPLE CHEMICAL VAPOR DEPOSITION SYSTEM AND METHODS FOR DEPOSITING MULTIPLE-METAL ALUMINIDE COATINGS

(75) Inventor: David C. Fairbourn, Sandy, UT (US)

(73) Assignee: Aeromet Technologies, Inc., Sandy, UT (US)

( * ) Notice: Subject to any disclaimer, the term of this patent is extended or adjusted under 35 U.S.C. 154(b) by 0 days.

(21) Appl. No.: 10/613,620

(22) Filed: Jul. 3, 2003

(65) Prior Publication Data
US 2005/0000425 A1    Jan. 6, 2005

(51) Int. Cl.
*C23C 16/12* (2006.01)
(52) U.S. Cl. .................. 427/250; 427/253; 427/255.28; 427/255.39; 427/255.394
(58) Field of Classification Search .............. 427/248.1, 427/250, 253, 255.28, 255.39, 255.394
See application file for complete search history.

(56) References Cited

U.S. PATENT DOCUMENTS

| 2,598,957 | A | 6/1952 | Wolfe .......................... 312/100 |
| 2,816,048 | A | 12/1957 | Galmiche .................... 117/107 |
| 3,329,601 | A | 7/1967 | Mattox ....................... 204/298 |
| 3,486,927 | A | 12/1969 | Gauje ....................... 117/107.2 |
| 3,507,248 | A | 4/1970 | Seeley et al. ................. 118/48 |
| 3,556,744 | A | 1/1971 | Berkley et al. ............. 29/183.5 |
| 3,801,357 | A | 4/1974 | Baldi ....................... 117/107.2 |
| 3,973,270 | A | 8/1976 | Schroder et al. |
| 3,979,534 | A | 9/1976 | Rairden, III ................. 427/405 |
| 4,076,380 | A | 2/1978 | DiMarcello et al. |
| 4,084,025 | A | 4/1978 | Rairden, III ................. 427/229 |
| 4,101,714 | A | 7/1978 | Rairden, III ................. 428/639 |
| 4,220,460 | A | 9/1980 | Partus .............................. 65/3 |
| 4,262,035 | A | 4/1981 | Jaeger et al. |
| 4,264,682 | A | 4/1981 | Fuyama et al. ............... 428/336 |
| 4,327,134 | A | 4/1982 | Baldi ......................... 427/253 |
| 4,396,213 | A | 8/1983 | Hawkins ..................... 285/287 |
| 4,427,720 | A | 1/1984 | Gauje .......................... 427/237 |
| 4,442,589 | A | 4/1984 | Doo et al. |
| 4,472,476 | A | 9/1984 | Veltri et al. |
| 4,476,178 | A | 10/1984 | Veltri et al. |
| 4,625,678 | A | 12/1986 | Shioya et al. ................ 118/723 |
| 4,641,603 | A | 2/1987 | Miyazaki et al. ............ 118/724 |
| 4,687,684 | A | 8/1987 | Restall et al. ............. 427/248.1 |
| 4,694,036 | A | 9/1987 | Baldi .......................... 524/473 |

(Continued)

FOREIGN PATENT DOCUMENTS

JP        55-058365        5/1980

*Primary Examiner*—Bret Chen
(74) *Attorney, Agent, or Firm*—Wood, Herron & Evans, L.L.P.

(57) ABSTRACT

A chemical vapor deposition (CVD) system and method for applying an aluminide coating constituted by two or more extrinsic metal components on a jet engine component. The aluminide coating is capable of forming a protective complex oxide upon subsequent heating in an oxidizing environment. At least one of the extrinsic metals in the aluminide coating is provided as a first vapor phase reactant from a receptacle coupled by a closed communication path with the reaction chamber of the CVD system and free of a carrier gas. The aluminide coating is formed by the chemical combination of the first vapor phase reactant with a second vapor phase reactant either created in situ in the reaction chamber or supplied by a carrier gas to the reaction chamber from a precursor source.

25 Claims, 3 Drawing Sheets

U.S. PATENT DOCUMENTS

| | | | |
|---|---|---|---|
| 4,699,084 A | 10/1987 | Wilson et al. ................ 118/725 |
| 4,816,291 A | 3/1989 | Desphandey et al. .......... 427/38 |
| 4,915,744 A | 4/1990 | Ho et al. |
| 4,935,193 A | 6/1990 | Grunke et al. ................. 427/12 |
| 4,961,958 A | 10/1990 | Desphandey et al. .......... 427/38 |
| 4,963,395 A | 10/1990 | Lewis et al. ................. 427/253 |
| 5,071,678 A | 12/1991 | Grybowski et al. ......... 427/253 |
| 5,114,559 A | 5/1992 | Ohta et al. ............. 204/298.05 |
| 5,132,755 A | 7/1992 | Ueno |
| 5,139,824 A * | 8/1992 | Liburdi et al. ............... 427/252 |
| 5,211,731 A | 5/1993 | Busse et al. |
| 5,261,963 A | 11/1993 | Basta et al. ................. 118/724 |
| 5,264,245 A * | 11/1993 | Punola et al. ............... 427/237 |
| 5,286,520 A | 2/1994 | Proscia |
| 5,300,313 A | 4/1994 | Anthony et al. |
| 5,308,399 A | 5/1994 | Pillhoefer et al. ........... 118/719 |
| 5,368,648 A | 11/1994 | Sekizuka .................... 118/733 |
| 5,372,645 A | 12/1994 | Fnthony et al. |
| 5,377,429 A | 1/1995 | Sandhu et al. ................ 34/586 |
| 5,407,704 A | 4/1995 | Basta et al. .............. 427/248.1 |
| 5,407,705 A | 4/1995 | Vakil ......................... 427/255 |
| 5,439,525 A | 8/1995 | Peichl et al. ................. 118/726 |
| 5,451,258 A | 9/1995 | Hillman et al. ............. 118/715 |
| 5,455,071 A | 10/1995 | Pillhoefer et al. .......... 427/253 |
| 5,514,482 A * | 5/1996 | Strangman .................. 428/623 |
| 5,624,721 A * | 4/1997 | Strangman .................. 427/585 |
| 5,632,820 A | 5/1997 | Taniyama et al. ........... 118/724 |
| 5,645,893 A * | 7/1997 | Rickerby et al. ............ 427/405 |
| 5,652,021 A | 7/1997 | Hunt et al. |
| 5,658,614 A | 8/1997 | Basta et al. |
| 5,679,448 A * | 10/1997 | Kawata ....................... 428/216 |
| 5,750,436 A | 5/1998 | Yamaga et al. .............. 438/558 |
| 5,820,641 A | 10/1998 | Gu et al. ....................... 55/269 |
| 5,823,416 A | 10/1998 | Haji ........................... 228/4.5 |
| 5,849,360 A | 12/1998 | Huang et al. |
| 5,851,293 A | 12/1998 | Lane et al. .................. 118/715 |
| 5,858,465 A | 1/1999 | Hunt et al. |
| 5,863,604 A | 1/1999 | Hunt et al. |
| 5,863,836 A | 1/1999 | Jones |
| 5,894,151 A | 4/1999 | Yamazaki et al. |
| 5,902,406 A | 5/1999 | Uchiyama et al. ........... 118/724 |
| 5,902,638 A * | 5/1999 | Vakil ....................... 427/248.1 |
| 6,013,318 A | 1/2000 | Hunt et al. |
| 6,083,321 A | 7/2000 | Lei et al. ..................... 118/719 |
| 6,089,184 A | 7/2000 | Kaizuka et al. ............. 118/723 |
| 6,143,361 A | 11/2000 | Near et al. ................ 427/248.1 |
| 6,156,123 A | 12/2000 | Pillhoefer et al. ........... 118/715 |
| 6,162,488 A | 12/2000 | Gevelber et al. |
| 6,221,512 B1 * | 4/2001 | Rickerby ..................... 428/623 |
| 6,254,983 B1 | 7/2001 | Namiki ....................... 428/336 |
| 6,258,461 B1 | 7/2001 | Baldi et al. ................. 428/469 |
| 6,291,014 B1 * | 9/2001 | Warnes et al. ............... 427/252 |
| 6,332,926 B1 | 12/2001 | Pfaendtner et al. .......... 118/721 |
| 6,395,343 B1 * | 5/2002 | Strangman .................. 427/454 |
| 6,440,496 B1 * | 8/2002 | Gupta et al. ................. 427/252 |
| 6,576,067 B2 * | 6/2003 | Spitsberg et al. ............ 148/277 |
| 6,602,356 B1 * | 8/2003 | Nagaraj et al. .............. 148/283 |
| 6,605,161 B2 | 8/2003 | Fairbourn ................... 148/243 |
| 6,646,328 B2 | 11/2003 | Tsai |
| 6,649,431 B2 | 11/2003 | Merkulov et al. |
| 6,689,422 B1 | 2/2004 | Warnes et al. .......... 427/255.11 |
| 6,692,324 B2 | 2/2004 | Simpson et al. |
| 6,709,907 B1 | 3/2004 | Yamazaki et al. |
| 6,730,164 B2 | 5/2004 | Vaartstra et al. |
| 6,784,049 B2 | 8/2004 | Vaartstra |
| 6,794,284 B2 | 9/2004 | Vaartstra |
| 6,803,135 B2 * | 10/2004 | Liu et al. .................... 428/701 |
| 6,894,754 B2 | 5/2005 | Ueda |
| 6,958,300 B2 | 10/2005 | Vaartstra et al. |
| 6,967,159 B2 | 11/2005 | Vaartstra |
| 6,984,592 B2 | 1/2006 | Vaartstra |
| 6,995,081 B2 | 2/2006 | Vaartstra |
| 7,030,042 B2 | 4/2006 | Vaartstra et al. |
| 7,041,609 B2 | 5/2006 | Vaartstra |
| 7,053,417 B2 | 5/2006 | Kim |
| 7,087,481 B2 | 8/2006 | Vaartstra et al. |
| 7,109,515 B2 | 9/2006 | Merkulov et al. |
| 7,112,485 B2 | 9/2006 | Vaartstra |
| 7,115,166 B2 | 10/2006 | Vaartstra et al. |
| 7,115,528 B2 | 10/2006 | Vaartstra et al. |
| 7,122,464 B2 | 10/2006 | Vaartstra |
| 7,148,542 B2 | 12/2006 | Yamazaki et al. |
| 7,196,007 B2 | 3/2007 | Vaartstra |
| 7,211,509 B1 | 5/2007 | Gopinath et al. |
| 2003/0032283 A1 | 2/2003 | Derderian et al. |
| 2003/0049374 A1 | 3/2003 | Warnes et al. |

* cited by examiner

SIMPLE CHEMICAL VAPOR DEPOSITION SYSTEM AND METHODS FOR DEPOSITING MULTIPLE-METAL ALUMINIDE COATINGS

CROSS-REFERENCE TO RELATED APPLICATIONS

This application is related to application Ser. No. 09/439,210, filed Nov. 12, 1999.

FIELD OF THE INVENTION

The invention relates to a simple chemical vapor deposition system and, in particular, to a simple chemical vapor deposition system equipped to form a protective layer on jet engine components.

BACKGROUND OF THE INVENTION

Superalloy jet engine components are exposed to extreme operating conditions that can deleteriously affect the surface thereof. In order to protect the surface, a sacrificial intermetallic layer is applied to the surface and forms a protective oxide layer while the jet engine component is in use. After the sacrificial intermetallic layer has worn thin during use, it is removed and a new sacrificial intermetallic layer is provided. This process is repeated as many times as possible to prolong the useful life of the jet engine component.

The intermetallic layer is commonly provided by a simple chemical vapor deposition (CVD) process in which the cleaned jet engine component is exposed to an oxygen-depleted environment of a reaction chamber. Inside the reaction chamber is typically an activator material and a donor material including at least one metal to be integrated into the intermetallic layer. The reaction chamber is purged of atmospheric gases and evacuated. The activator material and donor material are heated to generate vapor phase reactants that cause metal to be transported from the donor material to the jet engine component. The intermetallic layer formed on the jet engine component may include intrinsic metal diffused outwardly from the alloy forming the jet engine component. However, the intermetallic layer must also include at least one extrinsic metal originating from the donor material.

The most common extrinsic metal used in the intermetallic layer is aluminum. To that end, typical donor materials include aluminum such that aluminum forms the bulk of the intermetallic layer. It is desired, however, that there also be a meaningful concentration of a second, extrinsic metal in the intermetallic layer. Current techniques for integrating a second, extrinsic metal into the intermetallic layer are costly and cumbersome, and often result in less than desirable intermetallic layers.

For example, typical donor material may comprise powder or chunklets of a chromium aluminum alloy in which chromium is present in the alloy for raising the material's melting point. During the CVD process, it is believed that little if any of the chromium will actually be transported from the donor material to the jet engine component and, even if the chromium reaches the jet engine component, it may be incorporated into the intermetallic layer in a non-uniform manner. Indeed, as the aluminum is more chemically active than chromium, chromium from the donor material may not integrate in a significant concentration into the intermetallic layer until the aluminum from the donor material is exhausted. The result can be intermetallic layers characterized by inferior properties and/or unduly long cycle times. In certain applications, the inability to release chromium from the donor material may prevent the achievement of beneficial effects derived from the presence of chromium in the coating forming on the jet engine component.

Other approaches for integrating two extrinsic metals into the intermetallic layer suffer from comparable drawbacks. By way of example, it has been proposed to first coat the jet engine component with chromium or platinum by, for example, electroplating, before placing it into the reaction chamber of the simple CVD system and forming the intermetallic layer. While the result can be intermetallic layers containing chromium or platinum and aluminum, the latter originating from the donor material, the process involved is quite time-consuming and costly, and also uses significantly more chromium or platinum than required. Coatings formed by electroplating also suffer from non-uniformity due to the natural tendencies of electroplated coatings to be thicker at and near sharp edges.

Accordingly, there is a need for an improved CVD apparatus and method for applying an aluminide layer having two extrinsic metals to superalloy jet engine components and other types of superalloy components.

SUMMARY OF INVENTION

The present invention provides a CVD device and method for forming an aluminide layer containing two or more extrinsic metals on the exposed surface of a superalloy jet engine component without the drawbacks of prior processes and systems seeking that same goal. To this end, and in accordance with the principles of the present invention, a second extrinsic metal is provided from a separate receptacle external of the reaction chamber. The external receptacle has relatively-small volume and is adapted to hold solid material containing the second extrinsic metal, in which the external receptacle is heated and sealed but for a closed communication path that permits passive transport of a vapor phase reactant from the solid material containing the second extrinsic metal to the main CVD reaction chamber.

The first extrinsic metal can be provided in conventional fashion, such as from chunklets in a simple CVD reaction chamber, or from a donor-carrying gas inlet in a dynamic CVD reaction chamber. However, unlike dynamic CVD systems, the separate receptacle itself is passively coupled into the main reaction chamber by the closed communication path thereby eliminating any reliance upon a pressurized flow of a corrosive or inert carrier gas into or through the external receptacle. The receptacle is heated to a temperature effective for transforming the solid material containing the second extrinsic metal into a vapor phase reactant, which then migrates or diffuses into the main reaction chamber via the closed communication path. The second extrinsic metal is thus introduced into the main reaction chamber already in the vapor phase, but separately from the other extrinsic metal and without the assistance of a pressurized flow of a corrosive or inert carrier gas. The extrinsic metals in their vapor phases may then chemically combine at the surface of the jet engine component to form the intermetallic layer with the multiple extrinsic metals, but without the cost, waste, and/or other deficiencies of prior systems and methods that seek to introduce multiple extrinsic metals into the intermetallic layer.

While the exact mechanism for successful provision of two or more extrinsic metals at the jet engine component to form the intermetallic layer is not known with certainty, and not desirous of being bound by any particular mechanism or theory, it is nonetheless believed that diffusion of the vapor phase reactant from the receptacle to the main reaction chamber will arise from the pressure differential therebetween. Specifically, the confinement of the vapor phase reactant containing the second extrinsic metal inside the relatively smallvolume receptacle increases the local pressure and causes diffusion of the vapor phase reactant through the closed communication path to the larger volume inside the main reaction chamber. Every mole of the donor material for the second extrinsic metal converts 22.4 liters of gas at standard temperature and pressure. The vapor phase reactant in the receptacle flows from the region of high pressure (concentration) in the receptacle to the region of low pressure (concentration) in the main reactor chamber. Therefore, a pressurized flow of an inert or corrosive carrier gas is not needed for transporting the vapor phase reactant containing the second extrinsic metal to the main reaction chamber, as in a dynamic CVD system, which simplifies the deposition process and eliminates the need to handle possibly-hazardous gases. The receptacle also does not have to be configured with an inlet for a carrier gas, which simplifies the system design and operation and reduces operating cost.

In accordance with one aspect of the present invention, the receptacle may be positioned directly over top of the main reaction chamber, and may, further advantageously, sit thereon. The receptacle may be directly coupled into the reaction chamber through a short, rigid pipe or conduit, such that the receptacle is carried by and movable with the lid of the reaction chamber. In accordance with a further aspect of the present invention, the conduit(s) is also heated to maintain the second, extrinsic metal in the vapor phase, so that it does not condense as a liquid or precipitate out as a solid as it migrates from the receptacle to the main reaction chamber.

Advantageously, a short conduit is provided that has only two normally open apertures, one of which is engaged with the receptacle port, and the other of which is in fluid communication with the main reaction chamber, such as through a straight pipe or an elbow or closed-end tee. Consequently, there is no flow path for a carrier gas, such as the corrosive gases commonly used in dynamic CVD systems, to pass into or through the receptacle. An additional receptacle may be coupled in fluid communication with the short conduit to provide for a yet further source of an extrinsic metal, such as a third such metal.

By virtue of the foregoing, there is provided an improved CVD system and method in which aluminide layers containing at least two extrinsic metals can be formed on superalloy jet engine components that, upon heating in an oxidizing atmosphere, oxidizes to form an external layer or shell constituted by a complex oxide.

These and other objects and advantages of the present invention shall be made apparent from the accompanying drawings and description thereof

BRIEF DESCRIPTION OF THE DRAWINGS

The accompanying drawings, which are incorporated in and constitute a part of this specification, illustrate an embodiment of the invention and, together with a general description of the invention given above, and the detailed description of the embodiment given below, serve to explain the principles of the invention.

DETAILED DESCRIPTION OF PREFERRED EMBODIMENTS

Figure 1:
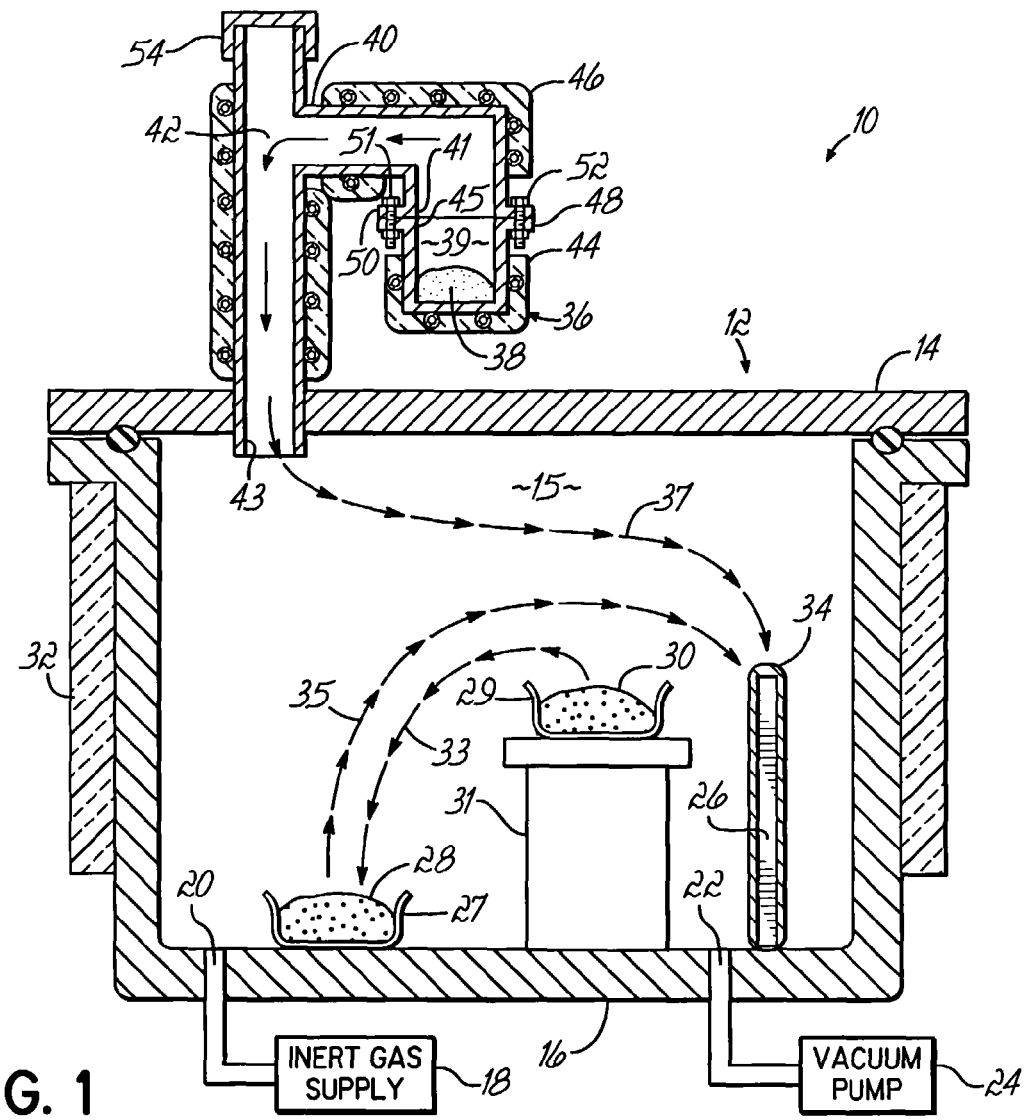
FIG. 1 is a diagrammatic view of a CVD apparatus in accordance with the principles of the invention.

With reference to FIG. 1, a CVD apparatus 10 in accordance with the principles of the invention includes a reaction chamber 12 consisting of a lid 14 and a vessel 16. The lid 14 has a sealing engagement with the vessel 16 that, when sealingly engaged, generally prohibits oxygen from entering the reaction chamber 12. An interior space 15 defines a deposition environment when the lid 14 is sealingly engaged with the vessel 16, purged of atmospheric gases, and evacuated. The lid 14 may be disengaged from the vessel 16 to afford access to the interior space 15. The reaction chamber 12 is formed from a metal that is resistant to corrosion from the CVD reactants, such as Inconel 601 or RA 353 MA.

An inert gas, such as argon, is supplied from an inert gas supply 18 to the reaction chamber 12 through an inlet port 20. An exhaust port 22 of the reaction chamber 12 is coupled with a vacuum pump 24 capable of evacuating the reaction chamber 12 to a vacuum pressure. A jet engine component 26 is introduced into the reaction chamber 12, and is situated away from a source of extrinsic metal, as explained below. The reaction chamber 12 is purged of reactive atmospheric gases, such as oxygen, by evacuating the interior 15 of reaction chamber 12 to a vacuum pressure using vacuum pump 24 and supplying the interior 15 of reaction chamber 12 with an inert gas from inert gas supply 18. The reaction chamber 12 is repeatedly evacuated and backfilled until the residual concentrations of reactive atmospheric gases are sufficiently low to not interfere with the subsequent deposition of the intermetallic layer.

Positioned within the reaction chamber 12 is a container or receptacle 27 holding a mass or charge of a solid donor material 28, a container or receptacle 29 holding a mass or charge of an activator material 30, and the jet engine component 26. Receptacle 29 is positioned on a pedestal 31 supported by the vessel 16. The jet engine component 26 is fabricated from any superalloy material. Appropriate activator materials 30 suitable for use in the invention include, but are not limited to, aluminum fluoride, aluminum chloride, ammonium fluoride, ammonium bifluoride, and ammonium chloride. Suitable solid donor materials 28 include alloys of chromium and aluminum, alloys of cobalt and aluminum, and alloys of vanadium and aluminum. The donor material 28 may be provided as a chunklet or as a powder separate from and independent of jet engine component 26 to provide a first extrinsic metal to an aluminide or intermetallic coating 34 to be formed on component 26.

With continued reference to FIG. 1, a heating element 32 is coupled in thermal contact with the reaction chamber 12 to provide efficient heat transfer to the activator material 30. The heating element 32 is operative for raising the temperature of the solid donor material 28 and the activator material 30 to approximately 2200° F., below which temperature the activator material 30 vaporizes. The vapor originating from the activator material 30 promotes the release of a vapor phase reactant from the solid donor material 28 confined within the interior space of the reaction chamber 12 and that contains an extrinsic metal, typically aluminum, that operates as an extrinsic metal source. The invention contemplates that a DC potential may be applied across the receptacle 29 in direct DC coupling with the jet engine component 26 for enhancing the deposition rate of the coating.

Positioned outside the reaction chamber 12 is a relatively-small receptacle 36 in which a solid donor material 38 is provided. The solid donor material 38, provided either as a dry solid such as a hydrated crystalline form or as a liquid, furnishes a source of a second extrinsic metal separate and distinct from the jet engine component 26. The second extrinsic metal combines with the first extrinsic metal supplied from donor material 28 to form the aluminide coating 34, exaggerated in thickness for purposes of clarity in FIG. 1, on the jet engine component 26. The composition of the solid donor material 38 differs from the composition of the solid donor material 28 present in the reaction chamber 12.

The receptacle 36 is dimensioned to hold the solid donor material 38. The reaction chamber 12 is dimensioned for holding the jet engine component 26. Therefore, the dimensions of the reaction chamber 12 are significantly larger than the dimensions of the receptacle 36. Because the receptacle 36 and the main chamber 12 share a deposition environment, the residual atmospheres therein are common. Any residual inert gas remaining within reaction chamber 12 and receptacle 36 from the evacuation and filling purge process represents part of the deposition environment. The vapor phase reactant containing the second extrinsic metal is transferred from the receptacle 36 to the reaction chamber 12 without the assistance of a pressurized carrier gas. It is appreciated by a person of ordinary skill in the art that the residual inert gas does not represent a carrier gas in that there is no pressurized flow of an identifiable carrier gas capable of transporting the vapor phase reactant containing the second extrinsic metal from the receptacle 36 to the reaction chamber 12. Generally, the volume of the reaction chamber 12 is at least a factor of ten larger than the volume of the receptacle 36 and conduit 40. In an exemplary embodiment, the receptacle 36 has a volume of about 50 cm$^3$, the reaction chamber 12 has a volume of about 27,000 cm$^3$, and the conduit 40 has a volume of about 10 cm$^3$.

With continued reference to FIG. 1, an interior 39 of the receptacle 36 is coupled in fluid communication with the interior 15 of the reaction chamber 12 by a conduit 40, that may have the form of a tee fitting, defining a vapor passageway 42. To that end, the conduit 40 has a pair of two normally open apertures 41, 43. Aperture 41 is sealingly coupled to a port 45 of receptacle 36 and aperture 43 is coupled for fluid communication into the reaction chamber 12 such that the reaction chamber 12 and receptacle 36 share a common and closed environment or atmosphere that permits transfer of vaporized donor material 38 to the reaction chamber 12. The vapor passageway 42 is advantageously free of valving so that the atmosphere inside the receptacle 36 cannot be isolated from the atmosphere inside the reaction chamber 12. Receptacle 36 is constructed from a material capable of sustaining a vacuum pressure of as low as 100 Torr. The conduit 40 may be constituted by pipe having a nominal pipe diameter of 0.5 inches and may be either schedule 40 or schedule 80, depending upon the line pressure. The receptacle 36 may be suspended above the lid 14 by conduit 40, may be supported from lid 14 by a support structure (not shown), or may be supported separately by an independent support structure (not shown).

The receptacle 36 may be opened for replenishing, when necessary, the charge of the second solid donor material 38, for changing the identity of solid donor material 38 to provide a different metal to the reaction chamber 12, or for cleaning. The receptacle 36 is sealed removably to the conduit 40 in a gas-tight manner. To that end, receptacle 36 includes an annular flange 48 that is capable of being sealed in a gas-tight manner to an annular flange 50 surrounding aperture 52 of conduit 40. The receptacle 36 may be lined with a ceramic crucible (not shown), such as an alumina crucible, to prevent the occurrence of corrosion initiated by the second donor material 38. The receptacle 36 may be provided with the capability of receiving a purging flow of an inert gas, such as argon, through, for example, an inlet 54, which is normally capped. The purging flow would be useful while loading the receptacle 36 with a mass or charge of the second donor material 38 and also before or after the coating process transpiring in the reaction chamber 12. The receptacle 36 may be formed from a nickel-based superalloy, such as Inco 600, Haynes 120, Inco 601, or Hastelloy C276, that is resistant to corrosion by chloride ions.

With continued reference to FIG. 1, the receptacle 36 and the conduit 40 leading to the reaction chamber 12 are heated with respective heaters 44, 46. Heater 46 is capable of heating the conduit 40 to a temperature of at least about 1000° F. Operation of the heater 46 prevents the metallic vapor phase reactant being transferred from receptacle 36 to the reaction chamber 12 from depositing as a liquid and/or solid on the internal surfaces of the conduit 40. Heater 44 should be capable of heating the receptacle 36 and the second donor material 38 to a temperature of at least 2000° F. within about 20 minutes. Either of the heaters 44, 46 may be constituted, for example, by multiple heating elements embedded in a ceramic element. Suitable heating elements are commercially available from Kanthal Globar (Niagara Falls, N.Y.).

The outward facing surface of heaters 44, 46 is thermally insulated such that machine operators cannot be burned while the receptacle 36 is hot. The receptacle 36 may be equipped with a temperature-measuring device (not shown), such as a thermocouple or more specifically a type K thermocouple, and a visible temperature display (not shown) electrically coupled with the temperature-measuring device. The temperature of the receptacle 36 is regulated to not exceed the vaporization temperature of the second donor material 38 by more than about 15° F. The heaters 44, 46 may be selectively energized by the operator or may be operated in an automated manner under the control of the reaction chamber 12 control system.

With continued reference to FIG. 1, the solid donor material 38 provided in receptacle 36 may be any solid metal-halogen Lewis acid having a composition containing a metal element selected to cooperate with the metal element in the vapor phase reactant generated from solid donor material 28 to form an aluminide coating on the exposed surface of the jet engine component 26. The metal-halogen Lewis acid is typically supplied as a solid material in a hydrated or anhydrous crystalline form such as chunklets or a powder, although the invention is not so limited, and is preferably aluminum-free. Such metal-halogen Lewis acids are characterized by a metallic element, such as chromium, zirconium, yttrium, hafnium, platinum, palladium, rhodium, iridium, titanium, niobium, silicon and cobalt chemically bound with a halogen, such as fluorine, chlorine, bromine, and iodine ion. Examples of appropriate Lewis acids include, but are not limited to, $AlCl_3$, $CoCl_4$, $CrCl_3$, $CrF_3$, $FeCl_3$, $HfCl_3$, $IrCl_3$, $PtCl_4$, $RhCl_3$, $RuCl_3$, $TiCl_4$, $YCl_3$, $ZrCl_4$, and $ZrF_4$. The metal-halogen Lewis acid may be ACS grade or reagent grade chemicals that are high in purity and substantially free of contaminants, such as sulfur. Upon heating, such metal-halogen Lewis acids convert from a dry solid form to a liquid form and, when the temperature is increased, convert from the liquid form to a vapor to provide a vapor phase reactant containing the extrinsic metal. By carefully controlling the temperature of the receptacle 36, regulation of the conversion to a vapor phase reactant can be used to regulate the introduction of the vapor phase reactant into the reaction chamber 12.

When heated to a sufficient temperature in the receptacle 36, the solid donor material 38 forms a vapor phase reactant conveyed or transported through the conduit 40 to the reaction chamber 12. The reaction chamber 12 and receptacle 36 advantageously share a common environment or atmosphere because one normally open aperture 43 of the conduit 40 is coupled for fluid communication with the interior 15 of reaction chamber 12 and the other normally open aperture 45 is sealingly coupled to the port of receptacle 36. This approach contrasts with dynamic CVD systems that rely instead on passing a corrosive gas, such as hydrochloric acid, or a carrier gas through a source material held by an external precursor chamber. The approach of the invention eliminates the dynamic CVD requirement for a gas source and plumbing to transport the carrier or corrosive gas from the gas source to receptacle 36. The mass or charge of solid donor material 39 added to receptacle 36 regulates the composition of the aluminide coating 34 forming on the jet engine component 26. For example, the mass of solid donor material 39 may be varied so that the coating 34 contains less than about 10 wt. % of the metal element from solid donor material 38.

The invention contemplates that the reaction chamber 12 may include a base plate upon which jet engine component 26, receptacle 27 and receptacle 29 are positioned and a bell jar made from metal that may be disengaged from the base plate for access. In this alternative embodiment, conduit 40 from receptacle 36 would communicate with the interior space 15 through the bell jar. The invention further contemplates that, in an alternative embodiment, the donor material 38 in receptacle 36 may be solid activator material that, upon heating to a sufficient temperature, is capable of providing additional vaporized activator material to the reaction chamber 12.

In use and with continued reference to FIG. 1, a jet engine component 26 is introduced into the reaction chamber 12, a charge of the first donor material 28 and a charge of the activator material 30 are introduced into the reaction chamber 12, and a charge of the second donor material is introduced into the receptacle 36. The interior 39 of the receptacle 36 and the interior 15 of the reaction chamber 12 are purged of atmospheric gases by repeatedly admitting an inert gas from inert gas supply 18 through an inlet port 20 and evacuating through exhaust port 22 with vacuum pump 24. After the last purge cycle, the receptacle 36 is evacuated to about a vacuum pressure of about 100 Torr. A first metallic component to be incorporated into the aluminide coating 34 is released from the first donor material 28 as a first vapor phase reactant mediated by vapors of the heated activator material 30, which are produced upon heating as indicated diagrammatically by reference numeral 33. Diffusion of the first vapor phase reactant to the jet engine component 26 is indicated diagrammatically by reference numeral 35.

Receptacle 36 is heated by heater 44 to a temperature effective to form a second vapor phase reactant from solid donor material 38, which is provided to the reaction chamber 12 through heated conduit 40 as indicated diagrammatically by reference numeral 37. The second extrinsic metal is thus introduced into the main reaction chamber already in the vapor phase, but separately from the other extrinsic metal. Extrinsic metals present in the individual vapor phase reactants combine at the exposed surface of the jet engine component 26 and form an aluminide coating 34 containing the different extrinsic metals on the jet engine component 26. Persons of ordinary skill in the art will recognize that additional steps, such as soaks and cleaning cycles, may be involved in the coating process. The jet engine component 26 is removed from the reaction chamber 12. In a heated oxidizing environment, such as when the jet engine component 26 is in service on an aircraft, oxidation of the exposed surface of the aluminide coating 34 forms a complex oxide that protects the underlying superalloy material from damage.

With regard to this specific application, the aluminide coating 34 on the jet engine component 26 has a limited service life and is gradually eroded away. Periodically, the jet engine component 26 must be inspected and possibly removed from service for re-application of the aluminide coating 34. Alternatively, the jet engine component 26 may be removed from service at regular intervals for reapplying the aluminide coating 34. After removal from service, any existing complex oxide layer and residual aluminide coating 34 on the jet engine component 26 is removed such as by acid stripping and/or grit blasting to expose a fresh surface of the component 26. The jet engine component 26 is again covered with another aluminide coating 34, according to the principles of the invention, and returned to service.

Figure 2:
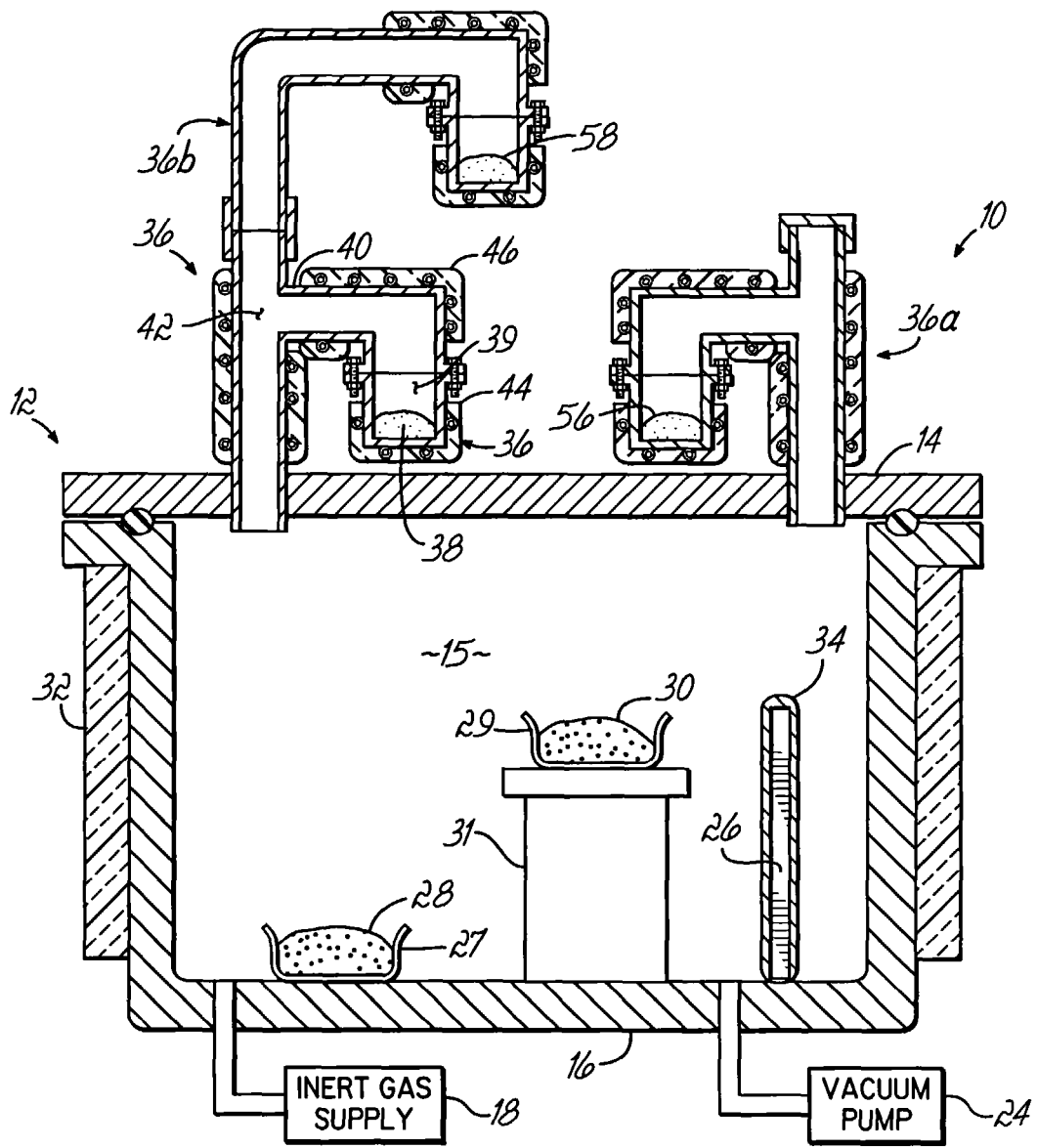
FIG. 2 is a diagrammatic view of an alternative embodiment of a simple CVD apparatus of the invention.

With reference to FIG. 2 in which like reference numerals refer to like features, the receptacle 36 may be positioned on top of, and in contact with, the lid 14 for structural support. This positioning reduces the travel path for the vapor phase reactant originating from the second donor material 38 in receptacle 36 to the reaction chamber 12 by shortening the length of the conduit 40. The positioning may be accomplished by changing the dimensions of conduit 40.

In an alternative embodiment of the invention and with reference to FIG. 2, a second receptacle 36a may be coupled passively in closed fluid communication with the reaction chamber 12. Receptacle 36a is substantially identical to receptacle 36, other than holding a donor material 56 containing a third extrinsic metal differing in composition from the extrinsic metals in donor materials 28, 38. Receptacle 36a is joined in a closed communication path with reaction chamber 12 so that a vapor phase reactant originating from donor material 56 may be transported to the reaction chamber 12 without invoking a flow of a carrier gas. The extrinsic metal from receptacle 36a is thus introduced into the main reaction chamber 12 already in the vapor phase, but separately from the other extrinsic metals. The three extrinsic metals in their respective vapor phases chemically combine at the surface of the jet engine component 26 to form an intermetallic layer containing the multiple extrinsic metals.

In accordance with the principles of the invention, the simple CVD system of the invention with the added receptacle 36a may also be used, for example, to apply a second coating on the exposed surface of a previously-deposited aluminide coating. For example, a coating of yttria covering an aluminide coating would bind with sulfur that otherwise could have deleterious effects upon the performance of the aluminide when the jet engine component 26 is in service. The procedure for applying the second coating would entail reducing the temperature of receptacle 36, after the first coating is formed by the extrinsic metals from donor materials 28, 38 on the jet engine component 26, so that donor material 38 is no longer vaporized and heating receptacle 36a so that donor material 56 is vaporized for transfer to the reaction chamber 12.

With continued reference to FIG. 2 and in yet another alternative embodiment, a third receptacle 36b may coupled with an inlet 54a of the second receptacle 36b. Receptacle 36b is substantially identical to receptacles 36, 36a, other than holding a donor material 58 differing in composition from the extrinsic metals originating form donor materials 28, 38, and 56. In particular, receptacle 36b is joined in a closed communication path with receptacle 36a and reaction chamber 12 so that a vapor phase reactant originating from donor material 58 and a vapor phase reactant originating from donor material 56 and containing a fourth extrinsic metal may be transported to the reaction chamber 12 without a flow of a carrier gas. According to the principles of the invention, the simple CVD system of the invention with the added receptacle 36b may be used to provide a fourth extrinsic metal to the reaction chamber 12 for applying complex coatings containing up to four distinct extrinsic metals to the exposed surface of the jet engine component 34. For example, two coatings may be applied in cooperation with the additional extrinsic metals originating from receptacles 36, 36a, 36b, such as a transition coating graded in composition from aluminide to zirconia and, in particular, yttria-stabilized zirconium. The specific extrinsic metals provided to and combining at the jet engine component 26 would selected by regulating the temperatures of the receptacles 36, 36a, 36b. Such a graded coating would become an effective substrate for yttria-stabilized zirconia deposited in a subsequent physical vapor deposition (PVD) process.

Figure 3:
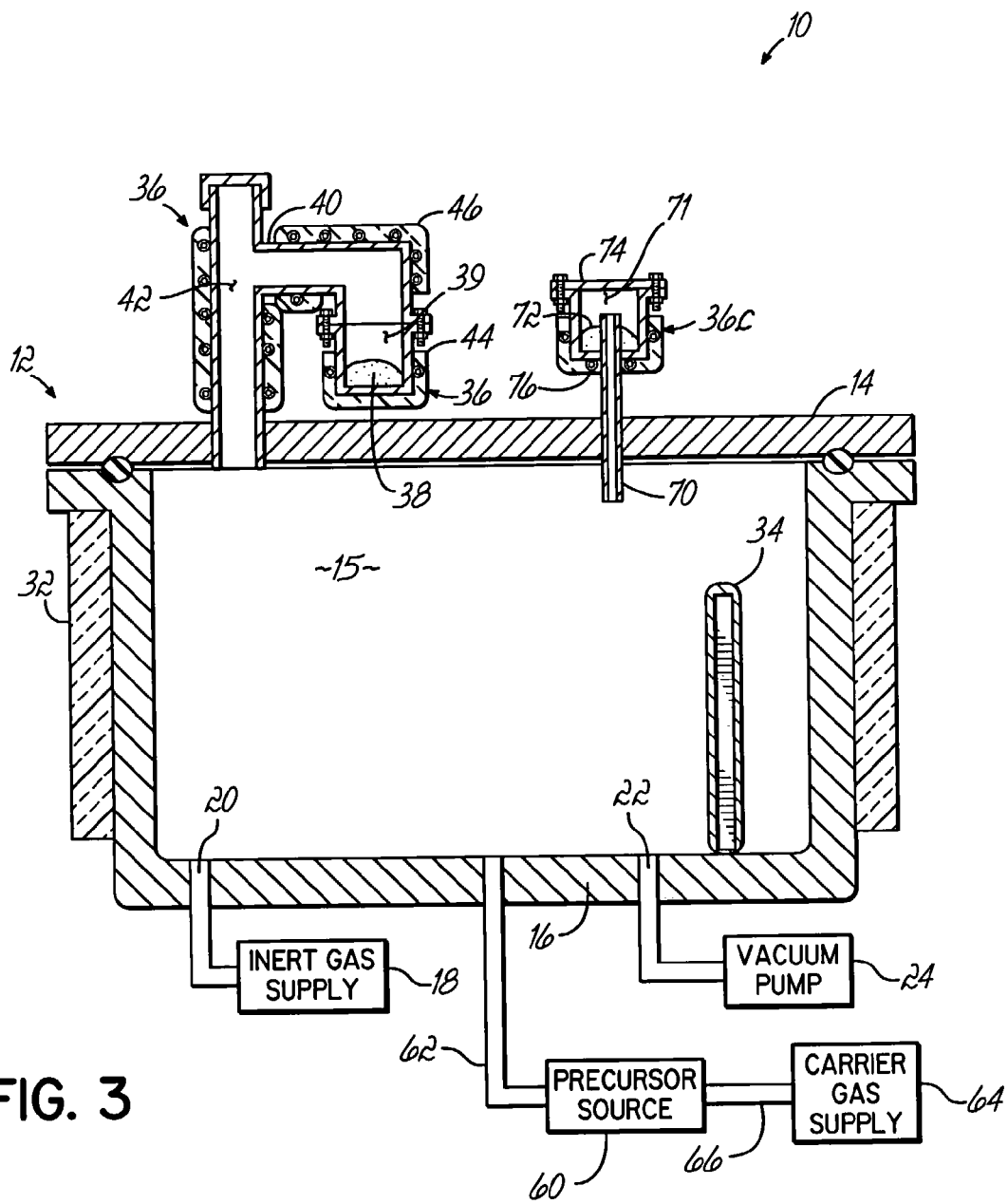
FIG. 3 is a diagrammatic view of an alternative embodiment of a simple CVD apparatus of the invention.

With continued reference to FIG. 3 and in yet another alternative embodiment of the invention, a precursor source 60 coupled with the reaction chamber 12 by a transport line 62. The precursor source 60 is charged with an amount of a suitable precursor containing an extrinsic metal and is heated to a temperature at which the precursor develops an appreciable vapor pressure to allow transport by a carrier gas to the reaction chamber 12. To that end, a regulated flow of carrier gas from a carrier gas source 64 is provided by a supply line 66 to precursor source 60. The carrier gas flows through the precursor source 60 and thereby entrains and mixes with the precursor vapor to create a gas mixture containing the extrinsic metal, which is transported via transport line 62 to the reaction chamber 12. The precursor source 60 replaces and substitutes for the receptacles 27, 29 (FIG. 1) as the first extrinsic metal is provided from precursor source 60 rather than the solid donor material 28. The extrinsic metal originating from the precursor source 60 is thus introduced into the main reaction chamber separately from the other extrinsic metal transported from receptacle 36. The extrinsic metals in their vapor phases may then chemically combine at the surface of the jet engine component 26 to form an intermetallic layer containing multiple extrinsic metals.

With continued reference to FIG. 3 and in yet another alternative embodiment of the invention, an interior 71 of receptacle 36c is joined by a straight length of a heated conduit 70 in a closed communication path with reaction chamber 12. Similar to receptacles 36, 36a, 36b, receptacle 36c generates a vapor phase reactant from a suitable donor material 72 for passive transport through conduit 70 to reaction chamber 12 without the assistance of a flow of a carrier gas. The entrance to the conduit 70 is located in the head space in interior 71 above the charge of donor material 72 so that the vapor phase reactant can enter the conduit 70 for transport to the reaction chamber 12. The interior 71 of the receptacle 36c is accessible through a removable lid 74 and is heated by a heater 76.

While the present invention has been illustrated by the description of an embodiment thereof and specific examples, and while the embodiment has been described in considerable detail, it is not intended to restrict or in any way limit the scope of the appended claims to such detail. Additional advantages and modifications will readily appear to those skilled in the art. For example, conduit 40 may be shaped as an elbow rather than a tee. The invention in its broader aspects is therefore not limited to the specific details, representative apparatus and methods and illustrative examples shown and described. Accordingly, departures may be made from such details without departing from the scope or spirit of applicant's general inventive concept.

Having described the invention, what is claimed is:

1. A simple chemical vapor deposition method for forming an aluminide coating containing at least two different extrinsic metals on a jet engine component, comprising:
    coupling a single port of a receptacle in fluid communication with a main reaction chamber;
    heating the receptacle to form a first vapor phase reactant including a first extrinsic metal that is transported without assistance of a separate flow of a carrier gas from the receptacle to the main reaction chamber;
    generating a second vapor phase reactant including a second extrinsic metal inside the main reaction chamber, the second extrinsic metal differing in composition from the first extrinsic metal;
    heating the jet engine component; and
    contacting the first and second vapor phase reactants with the heated jet engine component to form the aluminide layer including the first and the second extrinsic metals, wherein the aluminide layer is capable of forming a complex oxide when heated in an oxidizing environment.

2. The simple chemical vapor deposition method of claim 1 wherein the first extrinsic metal of the first vapor phase reactant originates from a metal-halogen Lewis acid.

3. The simple chemical vapor deposition method of claim 2 wherein the second extrinsic metal is aluminum and the first extrinsic metal is selected from the group consisting of chromium, cobalt, hafnium, iridium, niobium, palladium, platinum, rhodium, silicon, titanium, yttrium, and zirconium.

4. The simple chemical vapor deposition method of claim 3 wherein the metal-halogen Lewis acid is provided as a hydrated or anhydrous crystalline form.

5. The simple chemical vapor deposition method of claim 2 wherein the metal-halogen Lewis acid is selected from the group consisting of $AlCl_3$, $CoCl_4$, $CrCl_3$, $CrF_3$, $FeCl_3$, $HfCl_3$, $IrCl_3$, $PtCl_4$, $RhCl_3$, $RuCl_3$, $TiCl_4$, $YCl_3$, $ZrCl_4$, and $ZrF_4$.

6. The simple chemical vapor deposition method of claim 1 wherein the jet engine component is fabricated from a superalloy.

7. The simple chemical vapor deposition method of claim 1 wherein the second extrinsic metal constitutes less than 10 wt. % of the aluminide layer.

8. A simple chemical vapor deposition process comprising:
    placing a metal component in a deposition environment in a main reaction chamber;
    transporting a first vapor phase reactant containing a first extrinsic metal to the main reaction chamber via a closed pathway from an external receptacle and without assistance of a separate flow of a carrier gas;
    providing a second source of a second extrinsic metal independent of the metal component in the main reaction chamber; and
    while the metal component is in the main reaction chamber, exposing the metal component, the first vapor phase reactant, and the second source to the deposition environment in the main reaction chamber for a time sufficient to form an aluminide layer at the metal component including the first and second extrinsic metals.

9. The simple chemical vapor deposition process of claim 8 wherein providing the second source further comprises:
    placing an activator material and a donor material containing the second extrinsic metal into the main reaction chamber; and
    reacting the activator material with the donor material to provide the second source.

10. The simple chemical vapor deposition process of claim 9 wherein reacting the activator material further comprises:
    heating the activator material sufficiently to cause migration of the activator material to the donor material and to cause a chemical reaction releasing the second source.

11. The simple chemical vapor deposition process of claim 8 wherein providing the second source further comprises:

transporting a vapor containing the second source to the main reaction chamber in a flow of carrier gas.

12. A simple chemical vapor deposition method for forming a coating on a jet engine component, comprising:
placing the jet engine component in a deposition environment in a main reaction chamber adapted to hold the jet engine component on which the coating is to be formed;
heating the jet engine component;
heating a receptacle external to the main reaction chamber to form a first vapor phase reactant;
transporting the first vapor phase reactant to the deposition environment inside the main reaction chamber via a closed first communication path coupling the receptacle with the main reaction chamber while the heated jet engine component is in the main reaction chamber and without assistance of a separate flow of a carrier gas;
providing a second vapor phase reactant including a second extrinsic metal independent of the jet engine component in the deposition environment inside the main reaction chamber; and
forming the coating including the first extrinsic metal on the heated jet engine component by cooperation between the first vapor phase reactant and the second vapor phase reactant.

13. The simple chemical vapor deposition method of claim 12 wherein the second vapor phase reactant includes a second extrinsic metal differing in composition from the first extrinsic metal.

14. The simple chemical vapor deposition method of claim 12 wherein forming the coating further comprises:
contacting the first and second vapor phase reactants with the heated jet engine component for a time sufficient to form the coating including the first and second extrinsic metals on the jet engine component.

15. The simple chemical vapor deposition method of claim 12 further comprising:
coupling a single port of the receptacle in fluid communication with the main reaction chamber, the receptacle being sealed but for the first communication path that is otherwise closed.

16. A simple chemical vapor deposition method for forming a coating on a jet engine component positioned inside a deposition environment of a main reaction chamber, the method comprising:
placing an amount of a metal-halogen Lewis acid material in a solid phase into a receptacle external to the main reaction chamber;
heating the metal-halogen Lewis acid held in the receptacle to form a first vapor phase reactant including a first extrinsic metal;
transporting the first vapor phase reactant from the receptacle to the deposition environment inside the main reaction chamber without assistance of a separate flow of a carrier gas from the receptacle to the main reaction chamber; and
contacting the first vapor phase reactant with the jet engine component to form the coating including the first extrinsic metal.

17. The simple chemical vapor deposition method of claim 16 wherein the metal-halogen Lewis acid is provided as a hydrated or anhydrous crystalline form.

18. The simple chemical vapor deposition method of claim 16 wherein the metal-halogen Lewis acid is selected from the group consisting of $AlCl_3$, $CoCl_4$, $CrCl_3$, $CrF_3$, $FeCl_3$, $HfCl_3$, $IrCl_3$, $PtCl_4$, $RhCl_3$, $RuCl_3$, $TiCl_4$, $YCl_3$, $ZrCl_4$, and $ZrF_4$.

19. The simple chemical vapor deposition method of claim 16 wherein the jet engine component is fabricated from a superalloy.

20. The simple chemical vapor deposition method of claim 16 wherein the coating is an aluminide layer, and further comprising:
generating a second vapor phase reactant including a second extrinsic metal inside the deposition environment, the second extrinsic metal differing in composition from the first extrinsic metal;
heating the jet engine component; and
contacting the first and second vapor phase reactants with the heated jet engine component to form the aluminide layer including the first and the second extrinsic metals.

21. The simple chemical vapor deposition method of claim 20 wherein the second vapor phase reactant is formed independent of the jet engine component in the deposition environment inside the main reaction chamber.

22. The simple chemical vapor deposition method of claim 20 wherein the second extrinsic metal is aluminum and the first extrinsic metal is selected from the group consisting of chromium, cobalt, hafnium, iridium, niobium, palladium, platinum, rhodium, silicon, titanium, yttrium, and zirconium.

23. The simple chemical vapor deposition method of claim 16 wherein heating the metal-halogen Lewis acid further comprises:
transforming the metal-halogen Lewis acid material from the solid phase through a liquid phase into a vapor phase to form the first vapor phase reactant.

24. The simple chemical vapor deposition method of claim 23 wherein the solid phase of the metal-halogen Lewis acid material is in a hydrated or anhydrous crystalline form.

25. The simple chemical vapor deposition method of claim 23 wherein transforming the metal-halogen Lewis acid material further comprises:
heating the receptacle to a first temperature effective to convert from the metal-halogen Lewis acid material from the solid phase to the liquid phase; and
continuing to heat the receptacle to a second temperature effective to convert from the liquid phase to the vapor phase of the first vapor phase reactant.

* * * * *

UNITED STATES PATENT AND TRADEMARK OFFICE
CERTIFICATE OF CORRECTION

PATENT NO. : 7,390,535 B2
APPLICATION NO. : 10/613620
DATED : June 24, 2008
INVENTOR(S) : David C. Fairbourn Page 1 of 1

It is certified that error appears in the above-identified patent and that said Letters Patent is hereby corrected as shown below:

In column 3, line 46, after "thereof", insert --.--.

In column 4, line 48, after "F", delete --.--.

In column 6, line 13, after "F", delete --.--.

In column 8:
Line 47, after "vaporized", insert --,--.
Line 51, after "may", insert --be--.

In column 9, line 6, after "would", insert --be--.

Signed and Sealed this

Second Day of June, 2009

JOHN DOLL
*Acting Director of the United States Patent and Trademark Office*